United States Patent
Hartmann

(10) Patent No.: US 6,836,137 B2
(45) Date of Patent: Dec. 28, 2004

(54) CONFIGURATION FOR TESTING SEMICONDUCTOR DEVICES

(75) Inventor: Udo Hartmann, Neuried (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/609,455

(22) Filed: Jun. 27, 2003

(65) Prior Publication Data

US 2004/0027891 A1 Feb. 12, 2004

(30) Foreign Application Priority Data

Jun. 27, 2002 (DE) .......................................... 102 28 764

(51) Int. Cl.$^7$ .............................................. G01R 31/26
(52) U.S. Cl. ..................................... 324/765; 324/158.1
(58) Field of Search ............................. 324/765, 158.1, 324/725, 754, 755, 117 H, 117 R, 127, 141; 714/724, 719, 720

(56) References Cited

U.S. PATENT DOCUMENTS 6,297,659 B1 * 10/2001 Saito .......................... 324/765
6,545,497 B2 * 4/2003 Hebert et al. ............... 324/765

FOREIGN PATENT DOCUMENTS

DE 693 07 965 T2 1/1994
JP 07218552 A 8/1995

* cited by examiner

*Primary Examiner*—David Zarneke
*Assistant Examiner*—Jimmy Nguyen
(74) *Attorney, Agent, or Firm*—Laurence A. Greenberg; Werner H. Stemer; Ralph E. Locher

(57) ABSTRACT

A current measuring device in the form of a Hall sensor device is disposed in an individual current/voltage supply line device with a common current/voltage supply unit for providing a particularly flexible configuration for testing a plurality of semiconductor devices for which the individual current consumption is to be measured during testing individually for each semiconductor device.

22 Claims, 3 Drawing Sheets

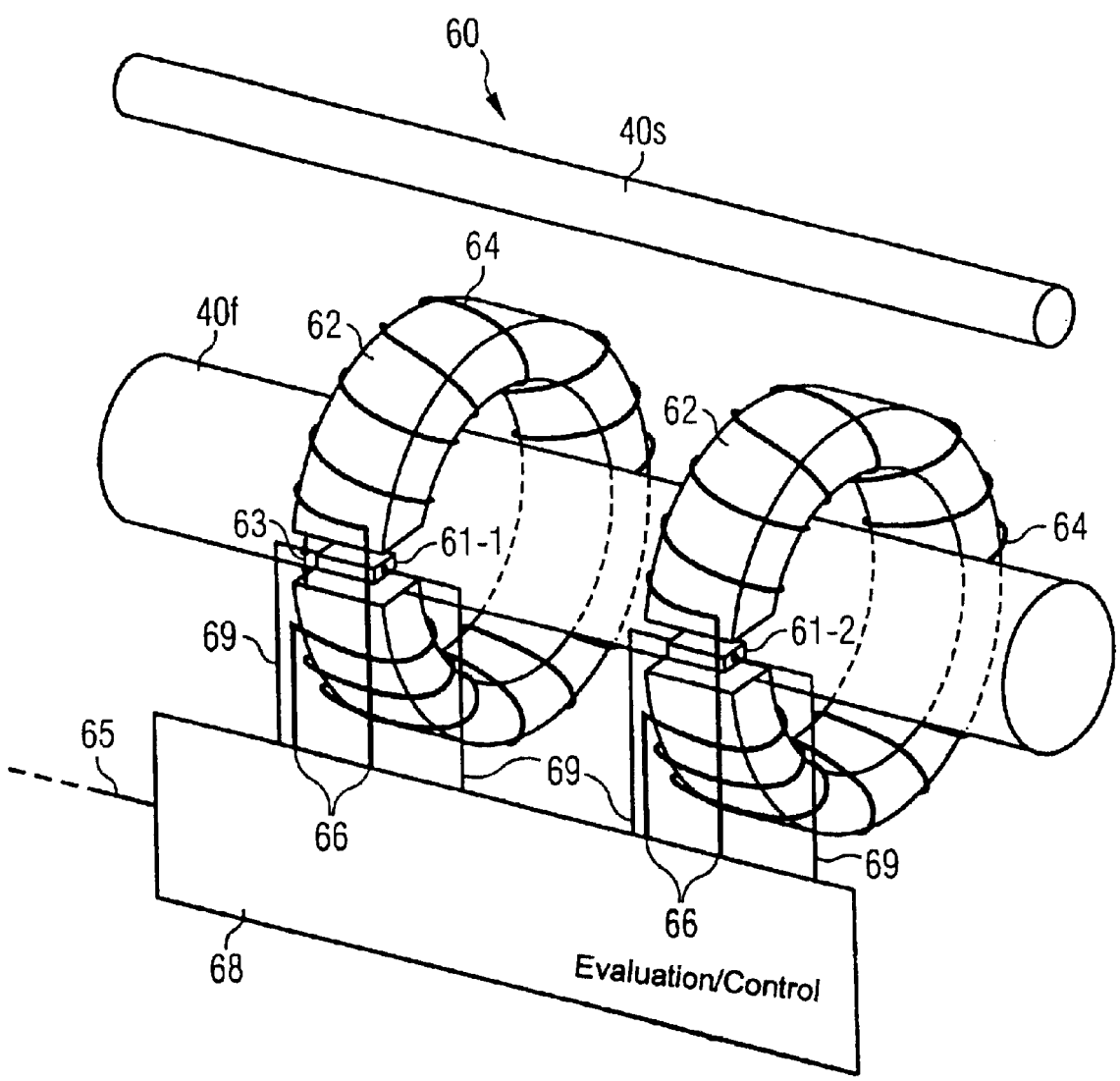

CONFIGURATION FOR TESTING SEMICONDUCTOR DEVICES

BACKGROUND OF THE INVENTION

1. Field of the Invention

The present invention relates to a configuration for testing semiconductor devices.

In the development and production of semiconductor devices, for example, memory devices, memory chips, wafers, and semiconductor modules, it is necessary to test the semiconductor devices during the development process or else during various intermediate stages of production in order to guarantee the functioning of the semiconductor devices and to be able to ensure quality assurance. In such a case, in addition to various functional parameters, if appropriate, the electric power consumption or the like is also determined individually for the individual semiconductor devices.

The influence of the test on the test result itself is problematic in the case of such functional tests that determine the parameters of the electric power consumption.

2. Summary of the Invention

It is accordingly an object of the invention to provide a configuration for testing semiconductor devices that overcomes the hereinafore-mentioned disadvantages of the heretofore-known devices of this general type and with which operating parameters of a plurality of semiconductor devices that relate to the electrical current consumption can be determined individually and, nevertheless, particularly flexibly and reliably.

With the foregoing and other objects in view, there is provided, in accordance with the invention, a configuration for testing semiconductor devices, including a common current/voltage supply unit for testing the semiconductor devices, a plurality of pairs of individual current/voltage supply line devices connected to the common current/voltage supply unit, each of the pairs adapted to connect one of the semiconductor devices to be tested to the common current/voltage supply unit, and current measuring devices respectively formed in the individual current/voltage supply line devices of each of the pairs and respectively measuring an individual current consumption of a given one of the semiconductor devices to be tested, each of the current measuring devices having at least one Hall sensor device. Preferably, the semiconductor devices are memory chips, wafers, or semiconductor modules, The present invention's configuration for testing semiconductor devices has a common current/voltage supply unit for semiconductor devices to be tested. Furthermore, a plurality of pairs of individual current/voltage supply line devices is provided for connecting the semiconductor devices to be tested to the common current/voltage supply unit. A respective current measuring device in an individual current/voltage supply line device of the respective pair of current/voltage supply line devices is provided for determining the individual current consumption of semiconductor devices to be tested. According to the invention, the respective current measuring device has, in each case, at least one Hall sensor device.

Consequently, it is a fundamental idea of the present invention to form the respective individual current measuring devices for the individual semiconductor devices in each case with at least one Hall sensor device. As a result, it is possible to determine the consumption of electric current by the respective individual semiconductor device with direct influencing being avoided to the greatest possible extent. Consequently, by the Hall sensor device, it is possible to determine an uncorrupted measurement result with regard to the electric current consumed by the individual semiconductor device.

In accordance with another feature of the invention, respective Hall sensor device is configured for measuring an electric current flowing in the respective current/voltage supply line device by a magnetic field that can be generated by the current.

In principle, according to the invention, in accordance with a further feature of the invention, the Hall sensor device may be formed with an individual Hall sensor that is, then, constructed for a specific measurement range with regard to the magnetic field impinging on it and, thus, with regard to the electric current flowing through the respective associated current/voltage supply line device. However, Hall sensors often have a comparatively narrow measurement range. Therefore, it is particularly advantageous if a plurality of Hall sensors are provided, a plurality of at most partly overlapping measurement ranges being formed, so that, as seen overall, the electric current flowing through an associated individual current/voltage supply line device can be detected particularly reliably across a wide range of values.

To further improve the measurement range characteristics and to improve the sensitivity of the respective Hall sensors, in accordance with an added feature of the invention, a magnetic field concentrating device is formed and provided for each Hall sensor, the concentrating device being configured for concentrating the magnetic field arising as a result of current flow in the associated current/voltage supply line device substantially onto the respective Hall sensor. This may be realized, for example, by a core of a soft-magnetic material respectively being provided as magnetic field concentrating device. The core may include, for example, ferrite or the like.

Furthermore, in accordance with an additional feature of the invention, the magnetic field concentrating device substantially encloses the cross-section of the respective associated and individual current/voltage supply line device at at least one location. What is, thus, achieved is that a large part of the magnetic field lines generated by the current/voltage supply line device and, thus, the magnetic flux cover the area formed by the enclosing by the magnetic field concentrating device.

Furthermore, in accordance with yet another feature of the invention, for concentration purposes it is provided that the magnetic field concentrating device has a gap, and that the respective associated Hall sensor is disposed in the region of the gap.

Hall sensors can be used in direct magnetic field measurement operation, in which the magnetic field strength or magnetic flux density and the corresponding current flow are determined directly by the Hall voltage generated on account of the Lorentz forces acting. However, an indirect technique is appropriate precisely when a higher accuracy is to be achieved. This indirect technique may be carried out, for example, in the context of a so-called compensation method and, then, the Hall sensor device is in each case formed as a compensation current converter or closed-loop-Hall transducer. In such a case, an additional device in the Hall sensor device generates a magnetic field that compensates as exactly as possible for the flux density of the field that is actually to be measured at the location of the Hall sensor. Based upon a corresponding calibration, the current flow that is necessary for compensation can, then, be used, for example, as a measure of the magnetic field that is actually to be measured and, thus, as a measure of the current that is actually to be measured in the associated individual current/voltage supply line device.

To such an end, in accordance with yet a further feature of the invention, a magnetic field compensation device is formed, in particular, in the form of a winding in the region of the magnetic field concentrating device, and further, preferably, around the core of soft-magnetic material.

In an advantageous manner, in accordance with yet an added feature of the invention, the present invention's configuration for testing semiconductor devices is configured for testing memory chips, wafers, or semiconductor modules.

The present invention's configuration for testing semiconductor devices has a particularly flexible and compact configuration when it is formed at least in part on a circuit board or a motherboard, in particular, a test device. Furthermore, in a special embodiment, it may be provided that the present invention's configuration for testing semiconductor devices has a needle card for making contact with semiconductor devices to be tested. Generally, it is possible to provide any contact-making apparatus.

Furthermore, in accordance with yet an additional feature of the invention, it is advantageous if the Hall sensor device is formed in each case in an integrated manner on the circuit board, the motherboard, or the needle card or, generally, the contact-making apparatus. This results in a particularly compact test configuration.

These and further aspects of the present invention also emerge based upon the further explanations as set forth below.

The invention relates, as has already been explained above, to the testing of memory chips, wafers, semiconductor devices, generally, and semiconductor modules, to be precise in high volumes. In such a case, the more accurate and contactless current measurement in the case of jointly used current/voltage supply units (programmable power supply ("PPS")) or shared power supplies is realized by the use of one or more Hall sensors.

Hitherto, in the case of a memory test, for example, there has been a restriction to a minimum of one current/voltage supply unit per chip in the desire to avoid disadvantages with regard to losses of yield due to short-circuited chips. In modern further developments, one current/voltage supply unit is divided between a plurality of chips without a loss of yield arising.

In conventional test configurations for semiconductor devices, electrical parameters with regard to the current consumption of the individual semiconductor devices or chips are implemented by way of a conventional current measurement by so-called shunts that are introduced in the PPS line and at which a potential difference proportional to the current flow can, then, be measured (indirect current measurement).

This conventional procedure has various disadvantages as set forth below.

A shunt in a line always means an electrical resistance, and, so, a voltage drop actually takes place at such a location. The voltage drop acts as an interference variable in the PPS line, to be precise, even when a correction to the sense point is effected downstream of the shunt.

For a plurality of measurement ranges, it is necessary to resort to the technique of a so-called switching matrix (relays, FETs, etc.) and, thus, to switch shunts of various sizes into the PPS path. Thus, it is not possible to change the measurement range with PPS switched on, to be precise, in the sense of hot switching. As a result, there is the risk of corrosion or burning-away of the contacts. In addition, the switching matrix has a certain additional susceptibility to interference, in particular, with regard to contact problems, with regard to additional contact resistances, and with regard to the driving of the switching matrix.

The presence of the shunt in the sense of a non-reactive resistance always implies an R-C-L combination, that is to say, a combination of non-reactive resistance R, capacitance C, and inductance L. In such a case, the capacitance C and the inductance L represent interference variables. The inductive part L has the greatest proportion in such a case and leads, if appropriate, to a slower transient recovery upon switch-on or power-up and also upon every change in the electric current during the measurement that is triggered, for example, by the test pattern, which drives the chip during the test. All this means an undesirable alteration of the test severity, to be precise, either a tightening or lessening.

Furthermore, with such a conventional procedure, the measurement range cannot be defined individually for a chip, unless an increased test time is accepted if measurement is performed with two or more measurement ranges.

In contrast thereto, in the case of the present invention, at least one Hall sensor device is provided for each current measuring device. In such a case, one or a plurality of Hall sensors are used, to be precise, for measuring the current in each of the shared PPS lines to individually determine the current consumption of each individual chip.

In such a case, it is possible to use very small Hall sensors. The positioning of a relatively large number of Hall sensors in a motherboard of a test device is, thus, unproblematic. Sensors having a size of 32·32 $\mu m^2$ with a pitch of 150 $\mu m$ may be involved in this case.

To cover larger measurement ranges, a plurality of sensors with different individual measurement ranges may be used jointly, for example, through the use of one sensor having a basic sensitivity of 50 $\mu T$ with the additional use of various ferrites having different relative permeabilities.

Moreover, the use as a compensation current converter or as a so-called closed-loop Hall transducer is appropriate to avoid nonlinearities in the region of high saturations and, thus, in the region of the edges of the measurement range of the respective sensor.

Moreover, it is appropriate to form the sensor in an integrated manner with its entire drive and evaluation electronics for the current measurement, for example, on modules that can be exchanged in a simple manner in the case of a defect.

The procedure according to the invention means that it is not necessary to define the respective measurement ranges prior to measurement. By way of example, measurement ranges of 10 mA and 100 mA may be defined. Experience shows that, by way of example, 95% of the chips in a current test lie below 10 mA, and 5% of the chips lie above 100 mA. Therefore, hitherto, a measurement method with a measurement range of 100 mA has, conventionally, been used. Reduced measurement accuracy with regard to 95% of the chips has had to be accepted. As an alternative thereto, it is possible, conventionally, to effect measurement twice, first with the measurement range of 10 mA and, then, with the measurement range of 100 mA. The measurement results for the range of 10 mA are used for all those chips that lie below this limit value. The measurement results for the measurement range relating to 100 mA are used for all those chips that lie above this limit. Such a procedure has an increased outlay in respect of time and management.

With the procedure according to the present invention, the evaluation and drive electronics with an interface to the tester can perform this task without any loss of time. By way of example, if a Hall sensor element having a measurement range of 10 mA reports saturation or an overflow, then the data of the element relating to 100 mA are automatically evaluated and used for the further classification.

A further advantage of the procedure according to the invention is the accommodation of the configuration or parts thereof on a motherboard. This also has advantages relative to the accommodation on the needle card. As a result, the configuration according to the invention can be used universally and, thus, serve as part of the tester. The configuration, for the most part, does not have to be realized anew and afresh for each product.

Other features that are considered as characteristic for the invention are set forth in the appended claims.

Although the invention is illustrated and described herein as embodied in a configuration for testing semiconductor devices, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 3 is a fragmentary, perspective and partially hidden view of a second preferred embodiment of the configuration for testing semiconductor devices according to the invention.

DESCRIPTION OF THE PREFERRED EMBODIMENTS

In the figures of the drawings, unless stated otherwise, identical reference symbols denote identical parts.

Figure 1:
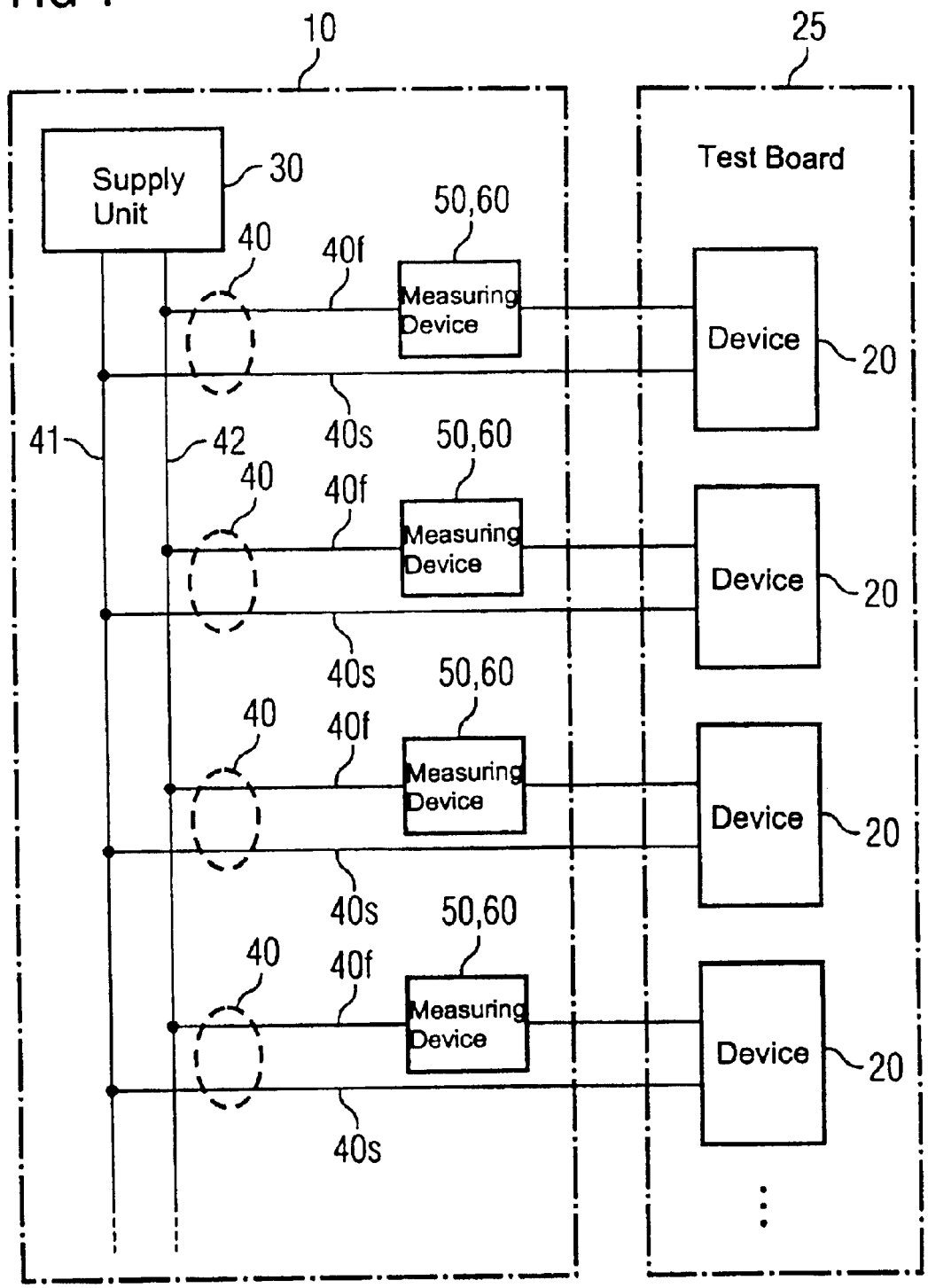
FIG. 1 is a block circuit diagram illustrating a first embodiment of the configuration for testing semiconductor devices according to the invention.

Referring now to the figures of the drawings in detail and first, particularly to FIG. 1 thereof, there is shown, in the form of a schematic block diagram, the fundamental construction of the invention's configuration 10 for testing a plurality of semiconductor devices 20. In such a case, the semiconductor devices 20 to be tested are disposed on a dedicated test board 25 and connected in a controllable manner, through non-illustrated bus systems, to the configuration 10 for testing the semiconductor devices 20. Each of the semiconductor devices 20 to be tested is connected to the common current/voltage supply unit 30 through a pair 40 of first and second current/voltage supply line devices 40f and 40s. In such a case, the coupling to the common current/voltage supply unit 30 takes place in a parallel manner through the main supply lines 41 and 42. To measure the current consumption of the semiconductor devices 20 to be tested during the tests, a current measuring device 50 in the form of a Hall sensor device 60 is provided in the respective first current/voltage supply device 40f, which is also referred to as a force line.

Figure 2:
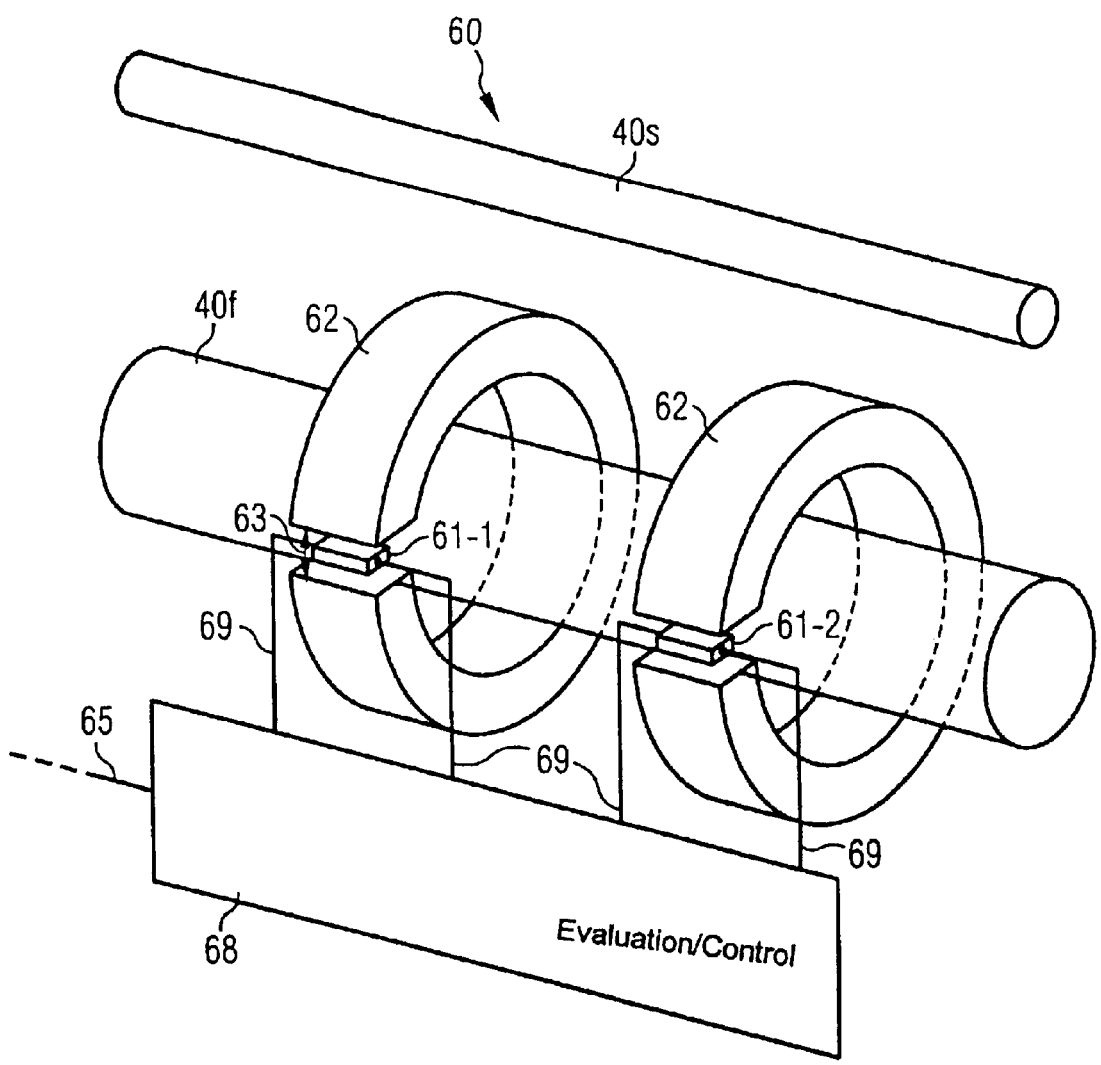
FIG. 2 is a fragmentary, perspective and partially hidden view of a first preferred embodiment of the configuration for testing semiconductor devices according to the invention.

FIGS. 2 and 3 show schematic detail views of the Hall sensor device 60. In the embodiments of FIGS. 2 and 3, the Hall sensor device 60 includes a first Hall sensor 61-1 and a second Hall sensor 61-2, which are connected respectively to an electronic control/evaluation unit 68 through control and evaluation lines 69. Through a further line device 65, the electronic evaluation/control unit 68 is connected through a corresponding interface to a super ordinate controller. The Hall sensors 61-1 and 61-2 are disposed respectively in a gap 63 of an, in each case, substantially toroidal magnetic field concentrating device 62 in the form of a ferrite core enclosing the first current/voltage supply line device 40f or force line device so that the magnetic field generated as a result of current flow in the first current/voltage supply line device 40f or force line device is concentrated by the ferrite core and directed onto the respective sensor 61-1 or 61-2 in the gap 63.

In supplementation thereto, in the embodiment of FIG. 3, each of the magnetic field concentrating devices 62 has a magnetic field compensation device 64 in the form of a winding around the ferrite core of the magnetic field concentrating device 62, which are, likewise, connected to the electronic evaluation/control unit 68 through control and supply lines 66.

I claim:

1. A configuration for testing semiconductor devices, comprising:
    a common current/voltage supply unit for testing the semiconductor devices;
    a plurality of pairs of individual current/voltage supply line devices connected to said common current/voltage supply unit, each of said pairs adapted to connect one of the semiconductor devices to be tested to said common current/voltage supply unit; and
    current measuring devices respectively formed in said individual current/voltage supply line devices of each of said pairs and respectively measuring an individual current consumption of a given one of the semiconductor devices to be tested, each of said current measuring devices having at least one Hall sensor device.

2. The configuration according to claim 1, wherein said Hall sensor device measures an electric current flowing in said respective current/voltage supply line device by a magnetic field generated by the current.

3. The configuration according to claim 1, wherein said Hall sensor device has one of:
    a Hall sensor measuring a given measurement range; and
    a plurality of Hall sensors measuring a plurality of given measurement ranges, said ranges at most partially overlapping one another.

4. The configuration according to claim 3, further comprising a magnetic field concentrating device for each of said Hall sensors, said magnetic field concentrating device concentrating the magnetic field arising as a result of the current flow in an associated one of said current/voltage supply line devices substantially onto a respective one of said Hall sensors.

5. The configuration according to claim 4, wherein said magnetic field concentrating device is a core of a soft-magnetic material.

6. The configuration according to claim 5, wherein said magnetic field concentrating device is a core of ferrite.

7. The configuration according to claim 4, wherein said magnetic field concentrating device substantially encloses a cross-section of a respective one of said current/voltage supply line devices at at least one location.

8. The configuration according to claim 4, wherein:
said magnetic field concentrating device has a gap; and
a respective one of said Hall sensors is disposed in a region of said gap.

9. The configuration according to claim 4, wherein:
said magnetic field concentrating device has a gap; and
a respective one of said Hall sensors is disposed in said gap.

10. The configuration according to claim 1, wherein said Hall sensor device is a compensation current converter or closed-loop Hall transducer.

11. The configuration according to claim 10, further comprising at least one magnetic field compensation device.

12. The configuration according to claim 11, further comprising a magnetic field concentrating device for each of said Hall sensors, said magnetic field concentrating device concentrating the magnetic field arising as a result of the current flow in an associated one of said current/voltage supply line devices substantially onto a respective one of said Hall sensors, said at least one magnetic field compensation device being a winding in a region of said magnetic field concentrating device.

13. The configuration according to claim 12, wherein:
said magnetic field concentrating device is a core of a soft-magnetic material; and
said at least one magnetic field compensation device is a winding around said core.

14. The configuration according to claim 1, wherein the semiconductor devices are at least one of memory chips, wafers, and semiconductor modules.

15. The configuration according to claim 1, further comprising a circuit board, said common current/voltage supply unit, said pairs of said individual current/voltage supply line devices, and said current measuring devices are at least partly formed on said circuit board.

16. The configuration according to claim 1, further comprising a motherboard, said common current/voltage supply unit, said pairs of said individual current/voltage supply line devices, and said current measuring devices are at least partly formed on said motherboard.

17. The configuration according to claim 1, further comprising a contact-making apparatus for contacting the semiconductor devices to be tested.

18. The configuration according to claim 17, wherein said contact-making apparatus is a needle card.

19. The configuration according to claim 15, wherein said Hall sensor device is integrated on said circuit board.

20. The configuration according to claim 16, wherein said Hall sensor device is integrated on said motherboard.

21. The configuration according to claim 18, wherein said Hall sensor device is integrated on said needle card.

22. A configuration for testing semiconductor devices including at least one of memory chips, wafers, and semiconductor modules, comprising:
a common current/voltage supply unit for testing the semiconductor devices;
a plurality of pairs of individual current/voltage supply line devices connected to said common current/voltage supply unit, each of said pairs adapted to connect one of the semiconductor devices to be tested to said common current/voltage supply unit; and
current measuring devices respectively formed in said individual current/voltage supply line devices of each of said pairs and respectively measuring an individual current consumption of a given one of the semiconductor devices to be tested, each of said current measuring devices having at least one Hall sensor device.

* * * * *